US009865573B2

(12) United States Patent
Kawano

(10) Patent No.: US 9,865,573 B2
(45) Date of Patent: Jan. 9, 2018

(54) LIGHT EMITTING DEVICE

(71) Applicant: NICHIA CORPORATION, Anan-shi, Tokushima (JP)

(72) Inventor: Yusuke Kawano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/408,032

(22) Filed: Jan. 17, 2017

(65) Prior Publication Data

US 2017/0207203 A1 Jul. 20, 2017

(30) Foreign Application Priority Data

Jan. 18, 2016 (JP) ................................ 2016-007477

(51) Int. Cl.
*H01L 25/07* (2006.01)
*H01L 25/075* (2006.01)
*H01L 33/62* (2010.01)
*H01L 33/48* (2010.01)

(52) U.S. Cl.
CPC ........ *H01L 25/0753* (2013.01); *H01L 33/486* (2013.01); *H01L 33/62* (2013.01)

(58) Field of Classification Search
CPC ..... H05K 1/0274; H01L 33/486; H01L 33/62; H01L 25/0753; F21V 19/0015
See application file for complete search history.

(56) References Cited

U.S. PATENT DOCUMENTS

| 9,611,985 B2* | 4/2017 | Hata ..................... H05K 1/0274 |
| 2005/0056932 A1* | 3/2005 | Shinjo .................... G11C 5/025 257/737 |
| 2015/0029712 A1* | 1/2015 | Nakamura .......... H01L 25/0753 362/231 |

FOREIGN PATENT DOCUMENTS

JP 2008-085324 A 4/2008

\* cited by examiner

*Primary Examiner* — Matthew Reames

(74) *Attorney, Agent, or Firm* — Foley & Lardner LLP

(57) ABSTRACT

A light emitting device including a supporting body; first wirings formed on a surface of the supporting body; second wirings formed on the surface of the supporting body; a plurality of first light emitting elements, which are flip-chip mounted on respective ones of the first wirings and are electrically connected to each other by the first wirings; and a second light emitting element electrically connected to at least one of the second wirings. The second light emitting element is disposed on at least one of the first wirings at a location between at least two of the electrically-connected first light emitting elements, without being electrically connected to said at least one of the first wirings.

12 Claims, 7 Drawing Sheets

LIGHT EMITTING DEVICE

CROSS-REFERENCE TO RELATED APPLICATION

The present application is based on and claims priority of Japanese Patent Application No. 2016-007477 filed on Jan. 18, 2016, the contents of which are hereby incorporated by reference in its entirety.

BACKGROUND

1. Technical Field

The present disclosure relates to a light emitting device.

2. Description of Related Art

Conventionally, light sources have been developed including light emitting elements that emit red light, green light, and blue light. For example, JP 2008-85324 A discloses a light source device in which one or more red light emitting elements (that is, light emitting elements configured to emit red light), green light emitting elements (that is, light emitting elements configured to emit green light), and blue light emitting elements (that is, light emitting elements configured to emit blue light) are employed, and the light emitting elements are configured to be controlled independently for each color, which allows for adjusting the color of emitted light.

SUMMARY

Such a light emitting device with which color of emitted light can be adjusted requires independent circuits corresponding to respective colors. In such a light emitting device, if the number of the light emitting elements is increased for improving luminance and the light emitting elements of respective colors are dispersedly disposed in consideration of color blending, multilayered wirings, which include two or more wiring layers, are required, so that cost may be increased.

According to certain embodiments of the present invention, a light emitting device can be provided with which light emitting elements configured to emit light of a plurality of colors can be driven independently for each color, without multilayered wirings.

A light emitting device according to one embodiment includes: a supporting body; first wirings formed on a surface of the supporting body; second wirings formed on the surface of the supporting body; a plurality of first light emitting elements flip-chip mounted on each of the first wirings and electrically connected to each other by the first wirings; and at least one second light emitting element electrically connected to the second wirings. The at least one second light emitting element is arranged on each of the first wirings at a portion between the electrically-connected first light emitting elements. The at least one second light emitting element is not electrically connected to the first wiring.

According to certain embodiments of the present invention, a light emitting device can be provided with which light emitting elements configured to emit light of a plurality of colors can be driven independently for each color, without multilayered wirings.

DETAILED DESCRIPTION OF EMBODIMENT

Figure 1:
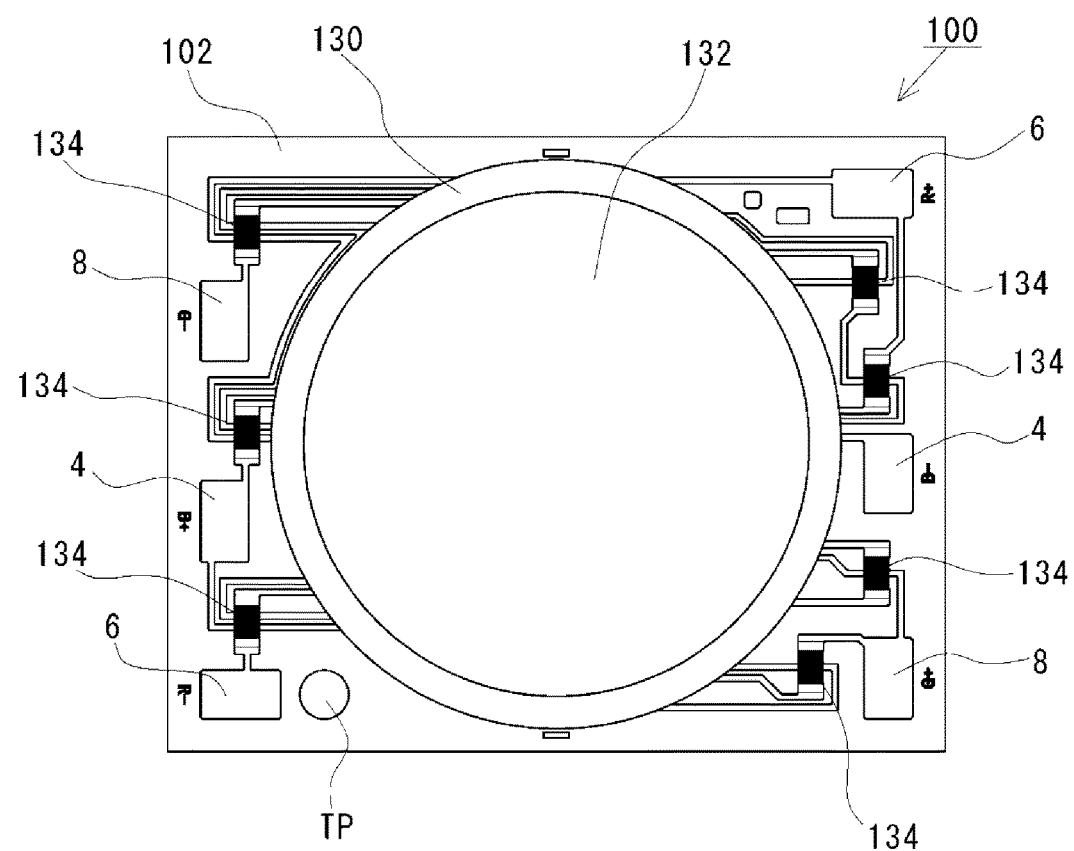
FIG. 1 is a schematic front view showing the overall structure of a light emitting device according to one embodiment of the present invention.

In the description below, embodiments of the present disclosure are illustrated with reference to the drawings as appropriate. Note that, the light emitting devices described below embody the technical ideas of the present invention, but the scope of the present invention is not intended to be limited thereto. Further, the description given in one embodiment or example is applicable to other embodiments or examples.

With reference to FIGS. 1 to 3C, a light emitting device 100 according to one embodiment of the present invention will be described. Note that, for ease of describing the shape of wirings and arrangement of light emitting elements, a frame body 130 and a sealing member 132 is not shown in FIG. 2. Further, in each of FIGS. 3A to 3C, only a supporting body and wirings of the light emitting device 100 are illustrated. First wirings, second wirings, and third wirings are indicated by solid shaded regions in FIGS. 3A to 3C, respectively.

As shown in FIGS. 1 to 3C, the light emitting device 100 according to the present embodiment includes a supporting body 102, and first wirings 104, second wirings 106, and third wirings 108 that are formed on a surface of the supporting body 102.

Figure 2:
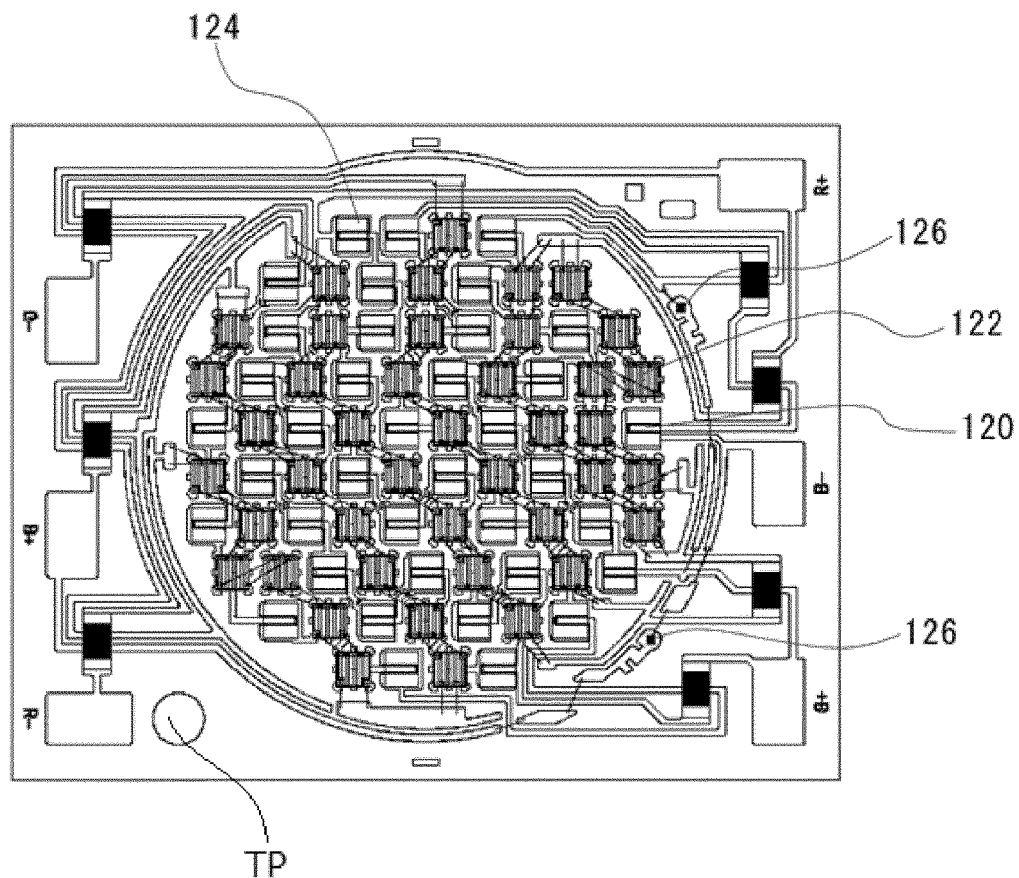
FIG. 2 is a schematic front view showing an inner structure of the light emitting device according to one embodiment of the present invention.
Figure 3A:
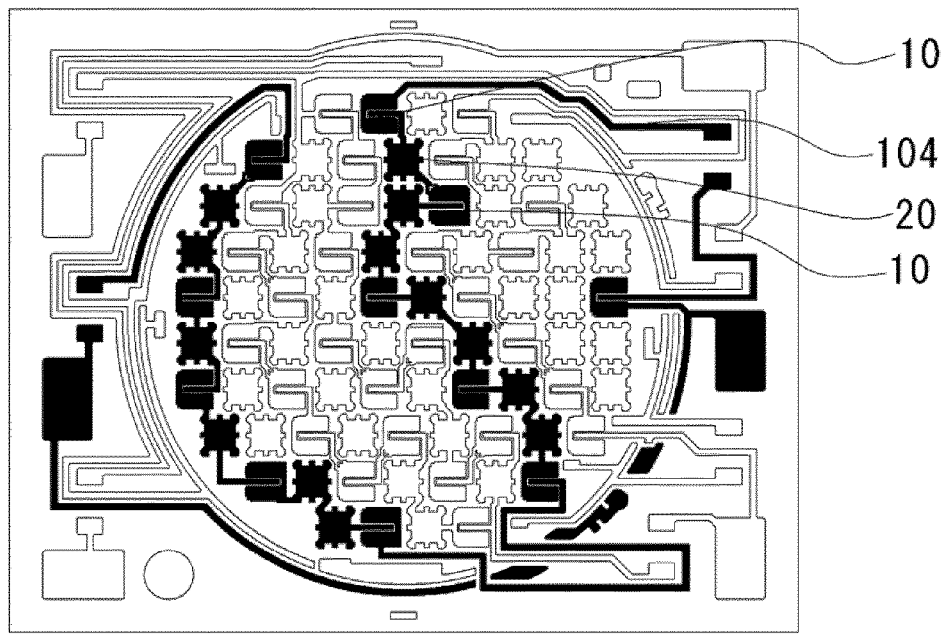
FIG. 3A is a schematic diagram showing first wirings.

In order to enable color adjustment, the present embodiment includes three systems of circuits so that light emitting elements of different three colors (e.g., RGB) can be driven independently for each color. As shown in FIGS. 2 and 3A, a plurality of first light emitting elements 120 are flip-chip mounted on the first wirings 104. The plurality of first light emitting elements 120 is electrically connected in series or parallel by the first wirings 104.

Further, second light emitting elements 122 are arranged on the first wirings 104. The second light emitting elements 122 are joined to each of the first wirings 104 with a joining member. The first wirings 104 and the second light emitting elements 122 are not electrically connected to each other. More specifically, a bottom surface of each second light emitting element 122 serves as a joining portion with each of the first wirings 104, and is insulated from a semiconductor structure of each second light emitting element 122. Each second light emitting element 122 includes one or more pairs of electrodes at an upper surface thereof. A metal film is preferably formed at the bottom surface of each second light emitting element 122, which allows for obtaining self-alignment effect using a joining member such as solder. The metal film is insulated from the semiconductor structure. Meanwhile, in order that each first light emitting element 120 is flip-chip mounted on each of the first wirings 104, each first light emitting element 120 includes one or more pairs of electrodes at a bottom surface side of the light emitting element 120. In the present specification, a surface of a light emitting element that faces upward when the light emitting element is placed on the supporting body 102 is referred to as the "upper surface of the light emitting element", and a surface of a light emitting element to be placed on the supporting body 102 is referred to as the "bottom surface of the light emitting element".

Each second light emitting element 122 arranged on each of the first wirings 104 is disposed between the first light emitting elements 120 electrically connected to each other. That is, the wiring that connects between the first light emitting elements adjacent to each other on the circuit serves also as a die-pad for the second light emitting element 122.

Figure 4:
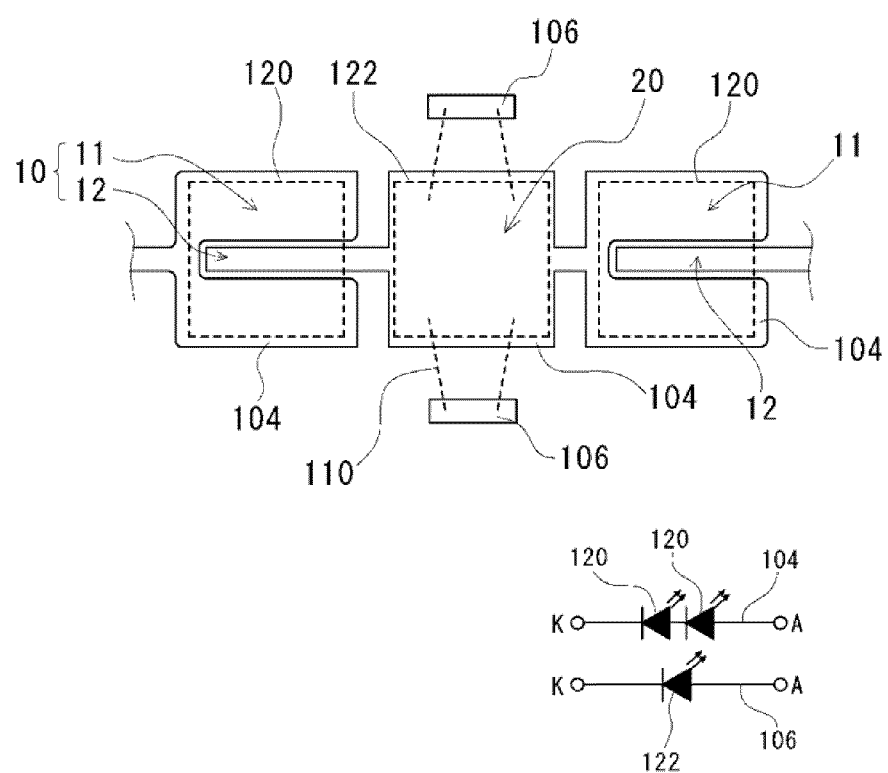
FIG. 4 is a schematic diagram for describing an example of the wirings according to one embodiment of the present invention.

FIG. 4 is a schematic diagram showing an example of arrangement of the first wirings 104 and the second wirings 106 according to the present embodiment. An outer shape of each of the first light emitting elements 120 and the second light emitting element 122 arranged on each first wiring 104 is represented by a broken line to be shown in a transparent manner.

In accordance with the number of the first light emitting elements 120 to be arranged, each of the first wirings 104 includes a plurality of first die pads 10 on each of which the first light emitting element 120 is to be arranged. Each first die pad 10 includes a first portion 11 connected to a first electrode (e.g., the P electrode) of the first light emitting element 120, and a second portion 12 connected to a second electrode (e.g., the N electrode) of the first light emitting element 120. The first portion 11 and the second portion 12 are disposed so as to be spaced apart from each other.

The one or more pairs of electrodes of each first light emitting element 120 is flip-chip connected to the first portion 11 and the second portion 12 via an electrically conductive member.

A second die pad 20 on which the second light emitting element 122 is to be arranged is formed at each of the first wirings 104 that electrically connects the first light emitting elements adjacent to each other on the circuit. In the example shown in FIG. 4, the second portion 12 of one first die pad 10, the second die pad 20, and the first portion 11 of another first die pad 10 are continuously formed. Thus, the first light emitting elements 120 are connected in series.

The second light emitting element 122 is arranged on the second die pad 20 of each of the first wirings 104. The portion of the second light emitting element 122 joined with the second light emitting element 122 is has an insulating property, so that the second light emitting element 122 and each of the first wirings 104 are not electrically connected to each other. In FIG. 4, the entire bottom surface of the second light emitting element 122 is located on the second die pad 20. The second die pad 20 preferably has a shape corresponding to the outer shape of the second light emitting element 122, so that the self-alignment effect using solder or the like can be obtained. The second die pad 20 may have a surface area smaller than that of the bottom surface of the second light emitting element 122. In this case, the second light emitting element 122 is arranged on both the first wiring 104 and the supporting body 102. In the case where the second die pad 20 is formed to be smaller that of the bottom surface of the second light emitting element 122, the second die pad 20 is preferably includes a portion corresponding to the outer shape of the second light emitting element 122, which allows for obtaining self-alignment effect.

Figure 6:
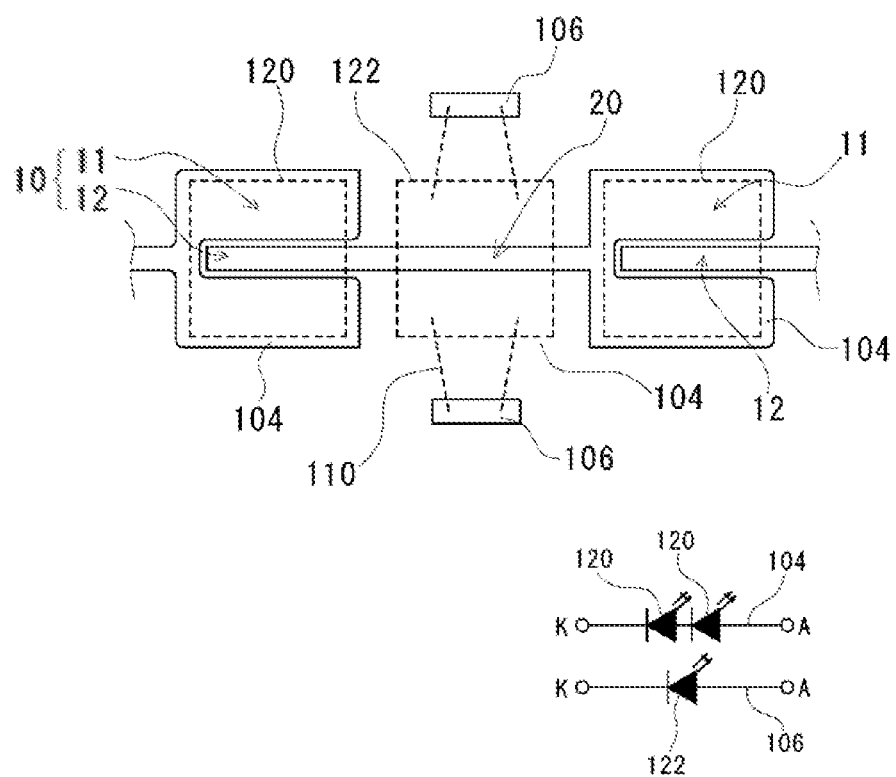
FIG. 6 is a schematic diagram for describing an example of the wirings according to one embodiment of the present invention.

Here, the term "second die pad 20" refers to a region of each of the first wirings with which the bottom surface of the second light emitting element 122 is in contact, and is not limited to an element with which the self-alignment effect can be obtained. For example, as shown in FIG. 6, the second die pad 20 may be a linear pattern connecting between the first die pads 10.

The second light emitting element 122 is electrically connected to the second wirings 106, which is not electrically connected to the first wirings 104. More specifically, one or more pairs of electrodes disposed on the upper surface of the second light emitting element 122 are electrically connected to the second wirings 106 by wires. While the two electrodes of one second light emitting element 122 are respectively connected to each of the second wirings 106 by wires in FIG. 4, a plurality of second light emitting elements 122 that are directly connected to each other by wires may be connected to each of the second wirings 106.

Figure 5:
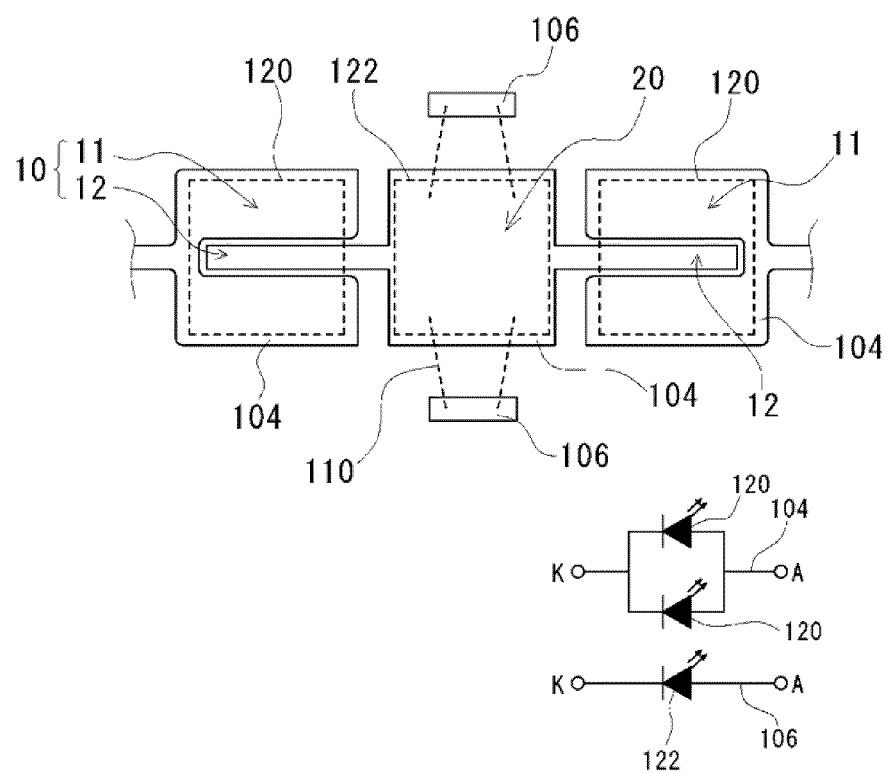
FIG. 5 is a schematic diagram for describing an example of the wirings according to one embodiment of the present invention.

FIG. 5 shows an example where the first light emitting elements 120 are connected in parallel.

In this case, second portions 12 of two first die pads 10 are formed to be connected with each other via the second die pad 20, which allows the first light emitting elements 120 to be connected in parallel.

As described above, on the wiring for driving the first light emitting elements 120, the second light emitting elements 122 are arranged not to be electrically connected to the wiring. This arrangement can prevent the wiring from have a multilayered structure, and the light emitting elements for emitting different colors can be dispersedly disposed in a limited region, while being driven independently for each color. With this arrangement, color unevenness due to uneven arrangement of light emitting elements of a particular light-emission color can be reduced. Further, with the wiring having a single-layered structure, increase in cost can be prevented. Also, even in the case in which the wiring is designed to have a multilayer structure, the number of layers can be reduced, so that similar effect can be obtained.

Further, the light emitting device can include at least one third light emitting element configured to emit light of a color different from that of the first light emitting elements and the second light emitting elements. The third light emitting elements 124 are preferably driven by a third wiring, which is controlled independently from the first and second wirings. With the light emitting elements configured to emit three colors of red, green, and blue, a color-adjustable light emitting device configured to emit light of a full color range can be provided.

Further, the third light emitting elements may be flip-chip mounted on the third wiring 108, and are electrically connected with each other via the third wiring 30. On the third wiring positioned between the third light emitting elements electrically connected to each other, the second light emitting element may be arranged so as not to be electrically connected to the third wiring. With this arrangement, the second light emitting elements can be arranged also on the third wiring, so that the light emitting elements of three types can be dispersedly disposed with ease.

Employing flip-chip mounting allows for improving dissipation of heat from the light emitting elements. Accordingly, a greater amount of current can be applied to a light emitting element. Consequently, the number of the light emitting elements used can be reduced. The number and the color of emitted light of the light emitting element of each type can be selected as appropriate in view of the color of emitted light of the light emitting device.

The electrodes of the first light emitting element 120 preferably has a planar shape that is substantially the same with that of the first die pad 10. Further, the bottom surface of the second light emitting element 122 preferably has a planar shape that is substantially the same as that of the second die pad 20. With this arrangement, at the time of mounting the light emitting elements using the joining member, alignment between the die pads and the light emitting elements can be facilitated making use of a self-alignment effect. Improvement of alignment precision allows for high-density packaging. The high-density packaging allows the diameter of emitted light to be decreased. For example, in order to reduce the diameter of emitted light and to intensify luminous flux, the gap between adjacent light emitting elements is preferably in a range of 0.1 mm to 0.5 mm.

Figure 3B:
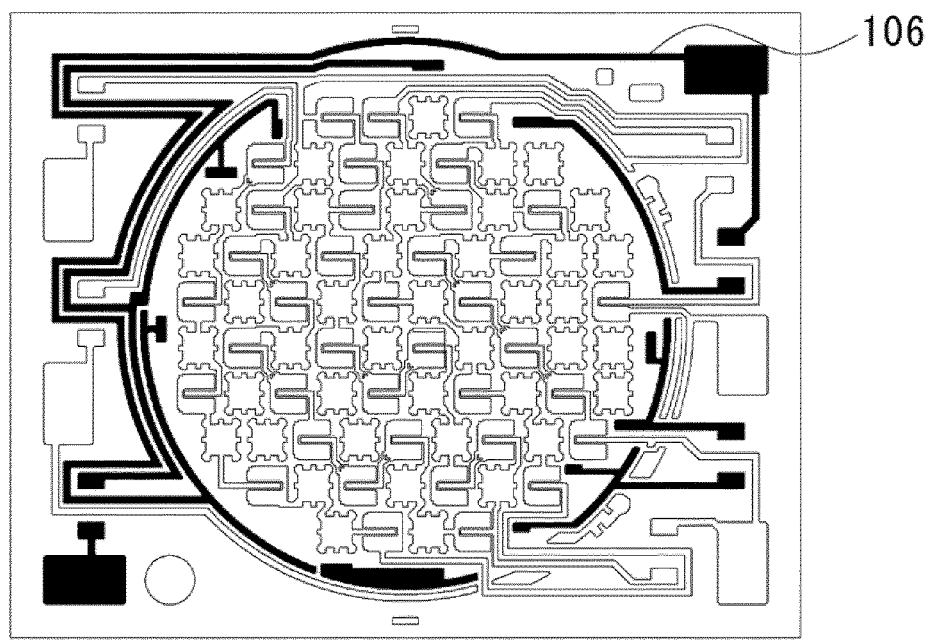
FIG. 3B is a schematic diagram showing second wirings.
Figure 3C:
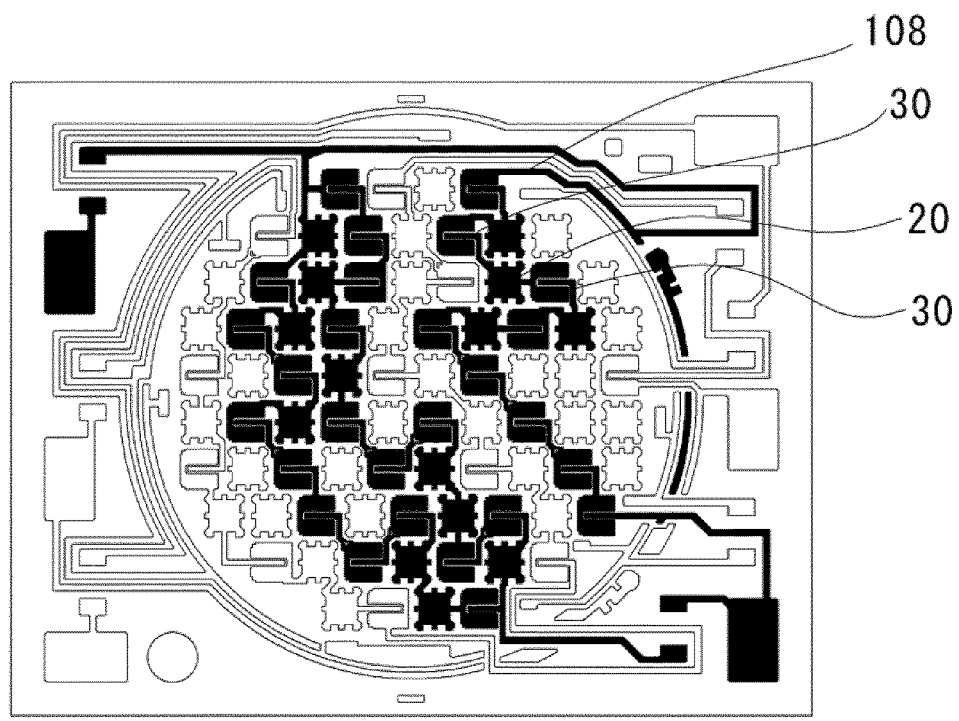
FIG. 3C is a schematic diagram showing third wirings.

Next, with reference to FIGS. 2 and 3, an example of a color-adjustable light emitting device in which light emitting elements that emit red, green, and blue light are used. In the example in FIG. 2, blue-color light emitting elements are employed for the first light emitting elements; red-color light emitting elements are employed for the second light emitting elements; and green-color light emitting elements are employed for the third light emitting element. The light emitting elements to emit respective colors are configured to be controlled independently for each color through the first wirings 104, the second wirings 106, and the third wiring 108, respectively. The first wirings 104 are indicated by a solidly shaded region in FIG. 3A. The second wirings 106 are indicated by a solidly shaded region in FIG. 3B. The third wirings 108 are indicated by a solidly shaded region in FIG. 3C.

In FIG. 2, the first light emitting elements 120 are connected in 11 series; the second light emitting elements 122 are connected in 14 series 3 parallel; and the third light emitting elements are connected in 9 series 3 parallel.

As shown in FIGS. 2 and 3, the second light emitting elements 122 are dispersedly disposed on both the first wirings 104 and the third wirings 108. Further, electrical connection through the first wirings 104, through the second wirings 106, and through the third wirings 108 is established by jumper resistors 134 so that the first wirings 104, the second wirings 106, and the third wirings 108 include a pair of electrode pads 4, a pair of electrode pads 6, a pair of electrode pads 8, respectively. The jumper resistors 134 are disposed at an outside of the frame body 130, that is, at an outside of the light emitting region so that ones of these wirings are disposed across other ones of these wirings.

The first, second, and third wirings include a plurality of electrode pads 4, 6, 8, respectively, at the end portions of the upper surface of the supporting body 102. Further, protective elements 126 are arranged on the first wirings and the third wirings, and are electrically connected in antiparallel with respect to the light emitting elements.

In the description below, a preferred mode of the light emitting device 100 according to the present embodiment is illustrated.

Supporting Body

The supporting body 102 is a member on a surface of which the first wirings 104, the second wirings 106, and the third wirings 108 are arranged, and serves as a mount on which the light emitting elements are arranged. In view of cost reduction, the supporting body 102 preferably has a flat plate-like shape and made of an insulating member. In other embodiments, the supporting body 102 may have recesses at portions where the light emitting elements are arranged.

For the material of the supporting body 102, an inorganic material, which is less easily deteriorated, is preferably used. In particular, a ceramic is preferably used. Examples of a ceramic include alumina, mullite, forsterite, aluminum nitride (AlN), silicon carbide (SiC), and a low temperature co-fired ceramic (LTCC). Among these, aluminum nitride is preferably used in view of improving a heat releasing property of the supporting body 102. Further, a material having a thermal conductivity of 160 W/m·K or greater is preferably used, and a material exhibiting a thermal conductivity of 170 W/m·K or greater is more preferably used.

Further, in order to increase the reflectivity of the supporting body 102 itself, the supporting body 102 may be formed to be porous, in which particles of an inorganic material such as alumina, yttria, zirconia, titania, diamond, calcium oxide, or barium sulfate are partially integrated to form numerous spaces. With this structure, the reflectivity of the supporting body can be increased due to difference in refractive index between air and such a material. For example, a material having a reflectivity of 80% or greater with respect to light with a wavelength of 450 nm is preferable, and a material having a reflectivity of 85% or greater with respect to light with a wavelength of 450 nm is more preferable.

Further, besides a ceramic, the supporting body 102 may be made of a resin material. Examples of such a resin material include a thermoplastic resin such as aliphatic polyamide resin, semiaromatic polyamide resin, polyethylene terephthalate, polycyclohexane terephthalate, liquid crystal polymer, polycarbonate resin, syndiotactic polystyrene, polyphenylene ether, polyphenylene sulfide, polyethersulfone resin, polyetherketone resin, and polyarylate resin, or a thermosetting resin such as polybismaleimide triazine resin, epoxy resin, silicone resin, silicone modified resin, epoxy modified resin, polyimide resin, polyurethane resin, and phenolic resin.

While an example of the supporting body 102 having a rectangular outer shape in a plan view is described above, the supporting body 102 may have any appropriate shape, and may have a square or polygonal outer shape.

First Wiring and Second Wiring

On a surface of the supporting body 102, the first wirings 104 and the second wirings 106 are disposed. The first wirings 104 and the second wirings 106 are each an electrically conductive member for supplying power to the light emitting elements. The first wirings 104 are electrically connected to the first light emitting elements 120, and the second wirings 106 are electrically connected to the second light emitting elements 122. Further, the wirings may include the electrode pads at end portions of the substrate for applying electricity from an external power supply. A connector may be connected to each of the electrode pads, and electricity may be supplied from the external power supply via the connector.

In the case in which a ceramic is employed for the supporting body 102, each wiring is formed as a metal layer. For example, each wiring may be formed by forming a metallized layer made of a high melting point metal on a surface of the supporting body 102 and thereafter baking the metallized layer and the supporting body 102 using a cofiring method. Alternatively, each wiring may be formed by post-firing, in which the supporting body 102 is sintered and various kinds of paste are applied onto the sintered supporting body 102 or a metal film is layered by sputtering on the sintered supporting body 102. Further, after a metal layer is formed on the surface of the substrate, a wiring pattern may be formed by etching or the like using dry film resist.

Each wiring may be formed by disposing a metal or alloy layer containing W, Mo, Ti, Ni, Au, Cu, Ag, Pd, Rh, Pt, Sn or the like as a main component on the supporting body 102.

More specifically, the metal layer may be formed by vapor deposition, sputtering, printing or the like. Further, plating may be further performed thereon. In view of low deterioration and high adhesion with the joining member, a metal containing Au as a main component may be employed as the uppermost surface of the wiring.

Further, in order to enhance heat releasing property, a layer made of Cu, which has a high thermal conductivity, may be formed thicker than other metals. For example, a layer containing Cu is preferably formed to have a thickness of 25 μm or greater.

Further, in the case where a resin is employed as the material of the supporting body 102, an electrically conductive member can be formed by attaching a metal plate to a prepreg (a semi-cured resin), thermally curing, and then patterning the metal plate through photolithography into a desired shape. In this case also, the surface may further undergo plating.

In forming the electrically conductive member, a mark for alignment, a mark indicating polarity, and a pattern for temperature measurement may be formed simultaneously. In the present embodiment, as shown in FIG. 2, a pattern for temperature measurement TP is formed.

Light Emitting Element

For the light emitting elements (the first light emitting elements 120 and the second light emitting elements 122), semiconductor light emitting elements such as LED elements, for example, may be employed.

Positive and negative electrodes of each light emitting element are formed at the same surface side of the semiconductor layered body. With this arrangement, flip-chip mounting may be used, in which the first die pad 10 of each of the first wirings 104 and the positive and negative electrodes of the light emitting element are joined so as to face each other.

Each of the positive and negative electrodes of the light emitting element can be, for example, a single-layer film or a layered film of Au, Pt, Pd, Rh, Ni, W, Mo, Cr, or Ti or alloy of these metals. More specifically, examples of the electrodes include a layered film in which metals are layered in the following manner, for example: Ti/Rh/Au, W/Pt/Au, Rh/Pt/Au, W/Pt/Au, Ni/Pt/Au, or Ti/Rh, from the semiconductor layer side. Such a film may have any thickness employed in the art.

The light emitting elements may be configured to emit ultraviolet light or visible light. With the first light emitting elements and the second light emitting elements configured to emit light of different colors, the light emitting elements can be controlled independently for each color, so that a color-adjustable light emitting device can be obtained. The light emitting device may further include a protective element or the like in addition to the light emitting elements. The protective element may be connected by wires, or may be flip-chip mounted.

Further, the light emitting elements may be configured to emit light of any desired color. For example, light emitting elements each including a wavelength conversion member such as a fluorescent material may be employed to emit white light. Alternatively, blue light emitting elements may be employed in combination with a red fluorescent material to serve as red light emitting elements.

Joining Member

The joining member serves to fix the light emitting elements to the first wirings 104.

The joining member may be made of any material known in the art. In the case where the first light emitting elements 120 are flip-chip mounted, an electrically conductive joining member may be employed. Examples of the joining member include a tin-bismuth based, tin-copper based, tin-silver based, and gold-tin based solder (more specifically, alloy containing Ag, Cu, and Sn as main components, alloy containing Cu and Sn as main components, and alloy containing Bi and Sn as main components); eutectic alloy (e.g., alloy containing Au and Sn as main components, alloy containing Au and Si as main components, and alloy containing Au and Ge as main components); electrically conductive paste or bumps made of silver, gold, palladium or the like; an anisotropic conductive material; and a brazing material such as a low melting point metal. Among these, with a solder, high-precision self-alignment effect can be obtained.

For joining the second light emitting elements 122, similarly to the member for bonding the first light emitting elements, an electrically conductive joining member is preferably used in the case where the second light emitting elements 122 can be surely insulated from the bonding member. With this arrangement, the self-alignment effect can be obtained. Further, in order to surely obtain insulating property, an insulating joining member may be employed.

Frame Body

As shown in FIG. 1, the frame body 130 is formed to have a frame-like shape so as to surround the light emitting elements on the supporting body 102. In this region surrounded by the frame body, a sealing member 132, which will be described below, is filled, so that the light emitting elements are covered by the sealing member.

The frame body preferably has light reflectivity. For the frame body, for example, insulating resin containing a light reflecting member is preferably used. Further, in order to reliably obtain strength of a certain level, for example, a thermosetting resin or a thermoplastic resin may be employed for the frame body. More specifically, phenolic resin, epoxy resin, BT resin, PPA, or silicone resin may be employed. In the case where a non-light emitting device such as a protective element is mounted on the substrate, the non-light emitting device, which may absorb light, is preferably embedded in the light-reflecting frame body. Such a frame body can be formed by drawing while discharging a resin with a dispenser, resin printing method, transfer molding, compression molding and the like.

In the case where the reflectivity of the frame body is greater than that of the wirings, the frame body is preferably formed so as to cover the wirings.

Sealing Member

The sealing member 132 is preferably a material that is electrically insulating, transmissive with respect to light emitted from the light emitting elements, and flowable before being cured. The sealing member preferably has a light transmittance of 70% or greater. Examples of the light-transmissive resin include silicone resin, silicone modified resin, epoxy resin, phenolic resin, polycarbonate resin, acrylic resin, polymethylpentene resin, polynorbornene resin, or hybrid resin that contains one or more of these resins. Among these, silicone resin has good heat resistance and light resistance, and has a small volume shrinkage after being cured, thus is preferable. The sealing member 132 may contain a wavelength conversion member configured to be excited by at least a part of light emitted by the light emitting elements and emit light of a wavelength different from that of the light emitting element.

Light emitting devices according to embodiment of the present invention are applicable as various kinds of illumination devices and the like.

100: light emitting device
102: supporting body
104: first wiring
106: second wiring
108: third wiring
4, 6, 8: electrode pad
10: first die pad
20: second die pad
30: third die pad
120: first light emitting element
122: second light emitting element
124: third light emitting element
126: protective element
130: frame body
132: sealing member
134: jumper resistor
TP: pattern for temperature measurement

What is claimed is:

1. A light emitting device comprising:
    a supporting body;
    first wirings formed on a surface of the supporting body;
    second wirings formed on the surface of the supporting body;
    a plurality of first light emitting elements, which are flip-chip mounted on respective ones of the first wirings and are electrically connected to each other by the first wirings; and
    a second light emitting element electrically connected to at least one of the second wirings,
    wherein the second light emitting element is disposed on at least one of the first wirings at a location between at least two of the electrically-connected first light emitting elements, without being electrically connected to said at least one of the first wirings.

2. The light emitting device according to claim 1, wherein:
    at least one of the first wirings includes a first die pad on which a corresponding first light emitting element is disposed and a second die pad on which the second light emitting element is disposed, and
    the first die pad has a first portion connected to a first electrode of said corresponding first light emitting element and a second portion connected to a second electrode of said corresponding first light emitting element.

3. The light emitting device according to claim 1, wherein the electrically-connected first light emitting elements are connected in series.

4. The light emitting device according to claim 1, wherein the electrically-connected first light emitting elements are connected in parallel.

5. The light emitting device according to claim 1, wherein the at least one second wiring and the second light emitting element are electrically connected to each other by at least one wire.

6. The light emitting device according to claim 1, wherein an entirety of a bottom surface of the second light emitting element is located on the at least one first wiring.

7. The light emitting device according to claim 1, wherein a color of light emitted from the first light emitting elements is different from a color of light emitted from the second light emitting element.

8. The light emitting device according to claim 1, comprising a plurality of the second light emitting elements, the plurality of second light emitting elements being connected to each other by at least one wire.

9. The light emitting device according to claim 1, wherein the supporting body is made of a ceramic.

10. The light emitting device according to claim 1, wherein each of the first light emitting elements is a blue light emitting element or a green light emitting element, and the second light emitting element is a red light emitting element.

11. The light emitting device according to claim 1, further comprising:
    third wirings disposed on the surface of the supporting body; and
    a plurality of third light emitting elements flip-chip mounted on the third wirings and electrically connected to each other by the third wirings,
    wherein the second light emitting element is disposed on at least one of the third wirings at a location between the electrically-connected third light emitting elements, without being electrically connected to said at least one of the third wirings.

12. The light emitting device according to claim 11, wherein each of the first light emitting elements is a blue-light emitting element, and each of the third light emitting elements is a green-light emitting element.

* * * * *